United States Patent
Zhang et al.

(10) Patent No.: US 8,941,997 B2
(45) Date of Patent: Jan. 27, 2015

(54) COMPUTER SERVER RETAINING APPARATUS AND SERVER CABINET USING THE SAME

(71) Applicants: Hong Fu Jin Precision Industry (ShenZhen) Co., Ltd., Shenzhen (CN); Hon Hai Precision Industry Co., Ltd., New Taipei (TW)

(72) Inventors: Guang-Yi Zhang, Shenzhen (CN); Jian Fu, Shenzhen (CN); Wen-Tang Peng, New Taipei (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 129 days.

(21) Appl. No.: 13/726,867

(22) Filed: Dec. 26, 2012

(65) Prior Publication Data

US 2013/0241378 A1    Sep. 19, 2013

(30) Foreign Application Priority Data

Mar. 15, 2012  (CN) .......................... 2012 1 0067655

(51) Int. Cl.
*H05K 5/00* (2006.01)
*H05K 7/00* (2006.01)
*G06F 1/16* (2006.01)
*H05K 5/02* (2006.01)

(52) U.S. Cl.
CPC .................................. *H05K 5/0221* (2013.01)
USPC ...... 361/726; 361/679.58; 361/724; 361/725; 361/727; 312/223.1; 312/223.2

(58) Field of Classification Search
USPC ........ 361/724, 725, 726, 727, 679.57, 679.58
See application file for complete search history.

(56) References Cited

U.S. PATENT DOCUMENTS

| | | | |
|---|---|---|---|
| 7,576,978 B2 * | 8/2009 | Fan et al. | 361/679.37 |
| 7,633,760 B2 * | 12/2009 | Wu et al. | 361/727 |
| 8,104,626 B2 * | 1/2012 | Huang et al. | 211/26 |
| 8,369,087 B2 * | 2/2013 | Wu et al. | 361/679.58 |
| 2004/0120106 A1 * | 6/2004 | Searby et al. | 361/683 |
| 2006/0274508 A1 * | 12/2006 | LaRiviere et al. | 361/727 |

* cited by examiner

*Primary Examiner* — Anthony Haughton
(74) *Attorney, Agent, or Firm* — Novak Druce Connolly Bove + Quigg LLP (57) ABSTRACT

A server cabinet for retaining at least one computer server includes a plurality of holding poles and a plurality of retaining apparatuses. Each of the plurality of retaining apparatuses is secured to a computer server and clamps a holding pole, such that the computer server is secured on the plurality of holding poles both vertically and horizontally by the plurality of retaining apparatuses.

14 Claims, 6 Drawing Sheets

COMPUTER SERVER RETAINING APPARATUS AND SERVER CABINET USING THE SAME

BACKGROUND

1. Technical Field

The present disclosure relates to computer server systems, and particularly to a computer server retaining apparatus and a server cabinet using the same.

2. Description of Related Art

A computer system can employ a plurality of servers to enhance data processing capability. For example, a common four-in-one server computer system includes four servers. All of the servers can be received in one server cabinet and share one hard disk backboard that is electrically connected to a plurality of hard disk drives.

A server cabinet may include a plurality of erect holding poles. A plurality of servers can be mounted on the holding poles and positioned at different heights. For easy attachment and detachment of servers from the server cabinet, each server mounted on the holding poles is held vertically (i.e., is prevented from moving upward and downward), but may be not be held stably horizontally (i.e., is not prevented from moving horizontally). When such a server cabinet is transported, the server(s) in the server cabinet may slide horizontally (e.g., due to impacts or inertia) and fall from the server cabinet.

Therefore, there is room for improvement within the art.

BRIEF DESCRIPTION OF THE DRAWINGS

Many aspects of the present disclosure can be better understood with reference to the following drawings. The components in the various drawings are not necessarily drawn to scale, the emphasis instead being placed upon clearly illustrating the principles of the present disclosure. Moreover, in the drawings, like reference numerals designate corresponding parts throughout the figure.

DETAILED DESCRIPTION

Figure 1:
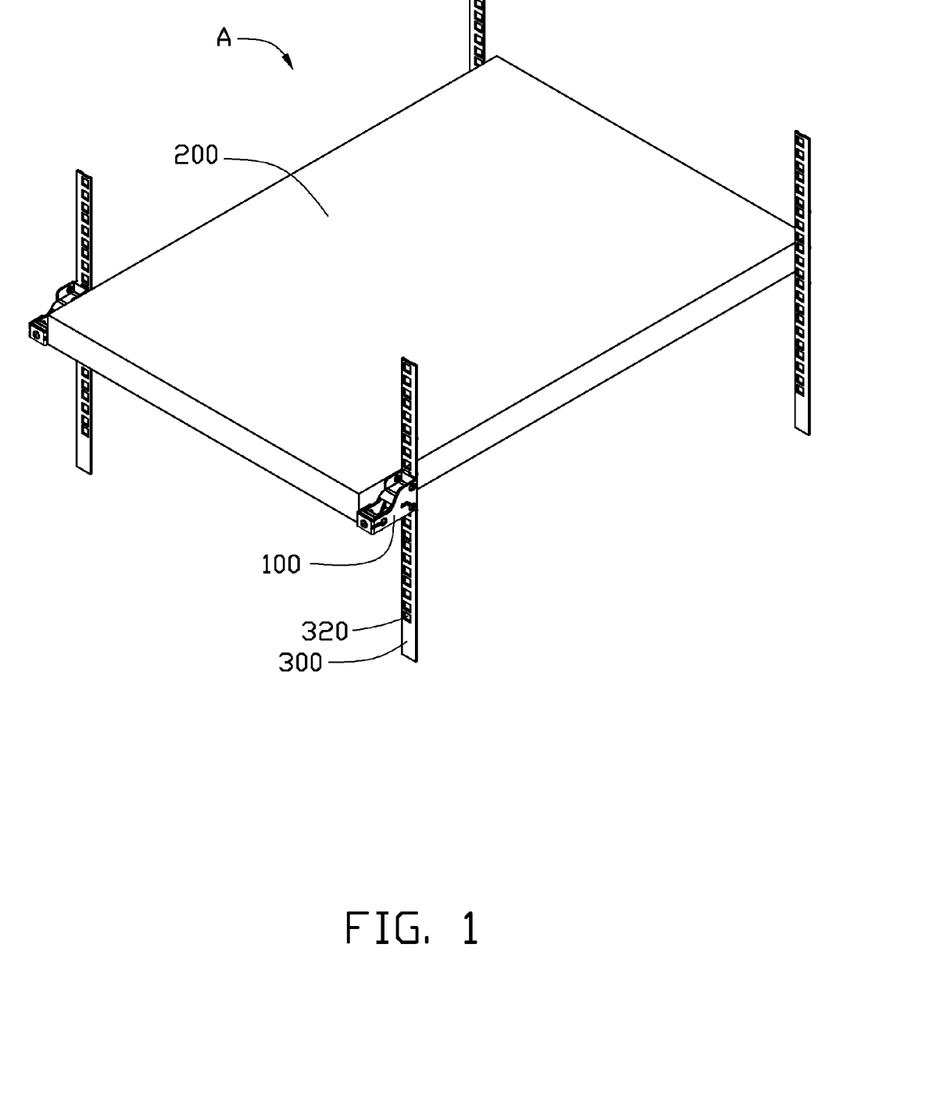
FIG. 1 is a schematic view of a server cabinet, according to an exemplary embodiment.

FIG. 1 shows a server cabinet A, according to an exemplary embodiment. The server cabinet A includes a plurality of retaining apparatuses 100 and a plurality of erect holding poles 300. At least one computer server 200 can be mounted on the holding holes 300 via the retaining apparatuses 100, and can be secured both vertically and horizontally by the retaining apparatuses 100. In this embodiment, each of the holding poles 300 defines a plurality of holding holes 320. Each of the retaining apparatuses 100 is fixed to the server 200, and engages with selected holding holes 320, so that the server 200 is mounted on the holding poles 300 at a predetermined height.

Figure 2:
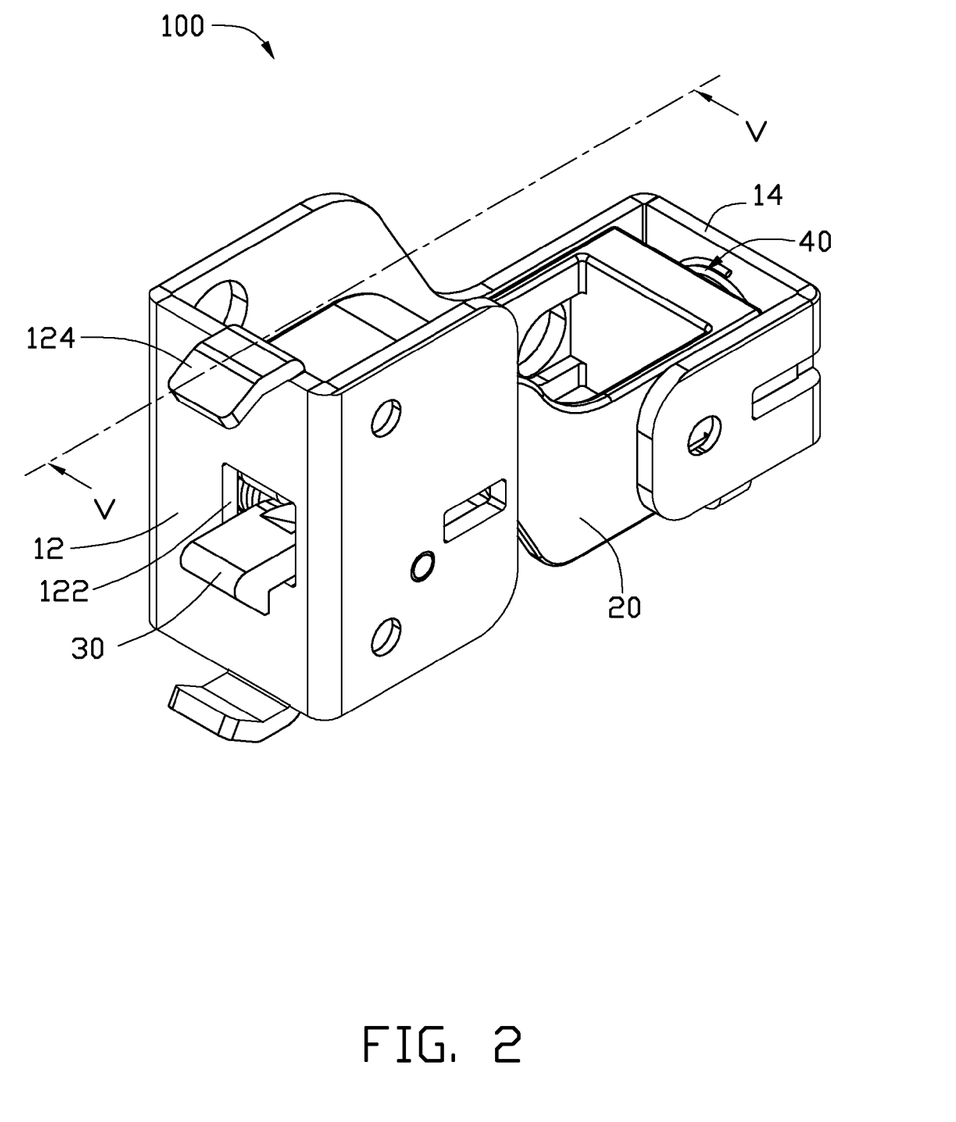
FIG. 2 is a schematic view of a retaining apparatus, according to an exemplary embodiment.

Also referring to FIG. 2, each of the retaining apparatuses 100 includes an outer case 10, an inner case 20, a rotation element 30 and an operation mechanism 40. The inner case 20, the rotation element 30, and the operation mechanism 40 are all received in the outer case 10, and the rotation element 30 and the operation mechanism 40 are exposed out of opposite ends of the outer case 10. The outer case 10 can be secured on the server 200. The rotation element 30 can engage with the holding holes 320 of the holding poles 300, and operations applied to the operation mechanism 40 drive the rotation element 30 to rotate and fasten the retaining apparatus 100 on a selected holding pole 300.

Figure 3:
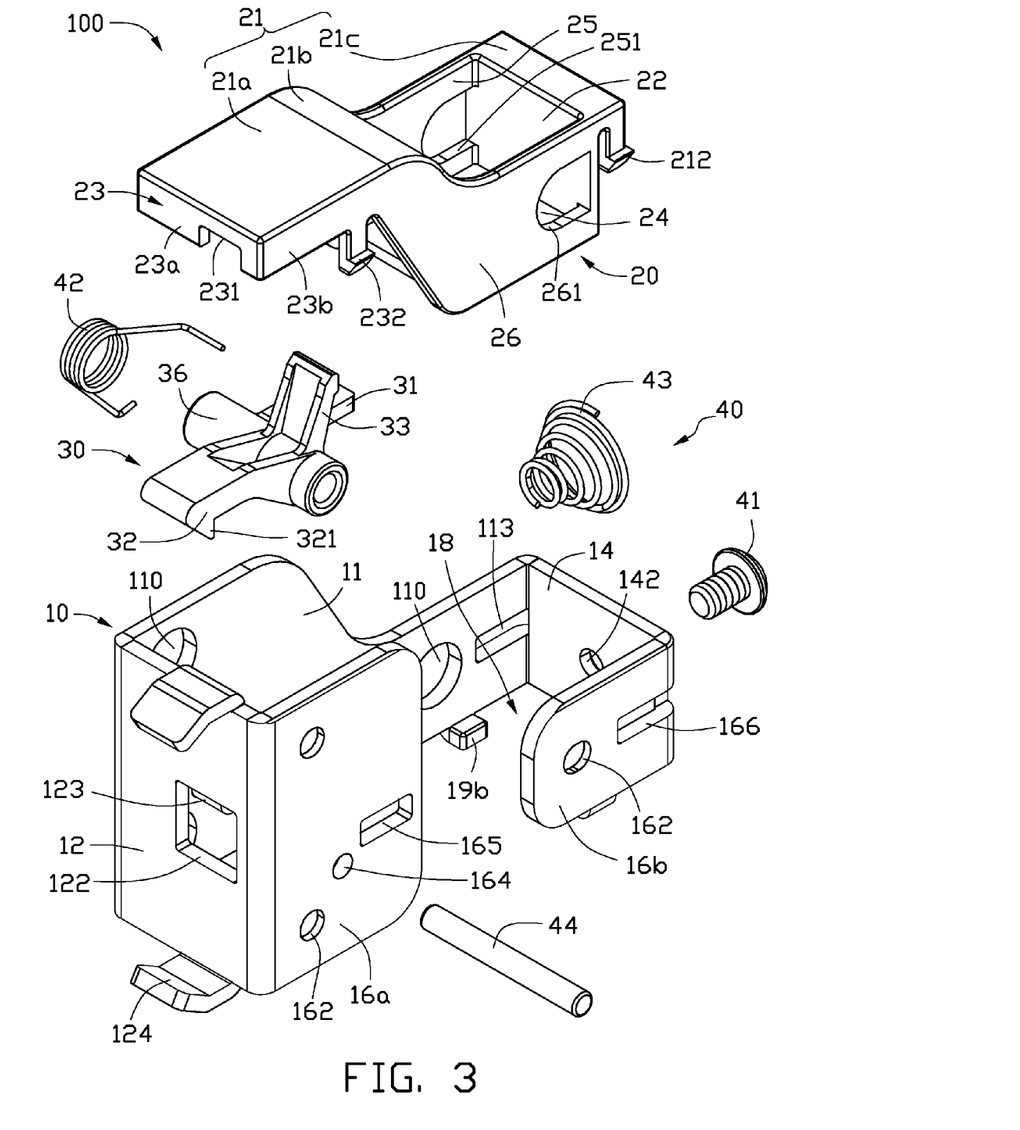
FIG. 3 is a disassembled view of the retaining apparatus shown in FIG. 2.
Figure 4:
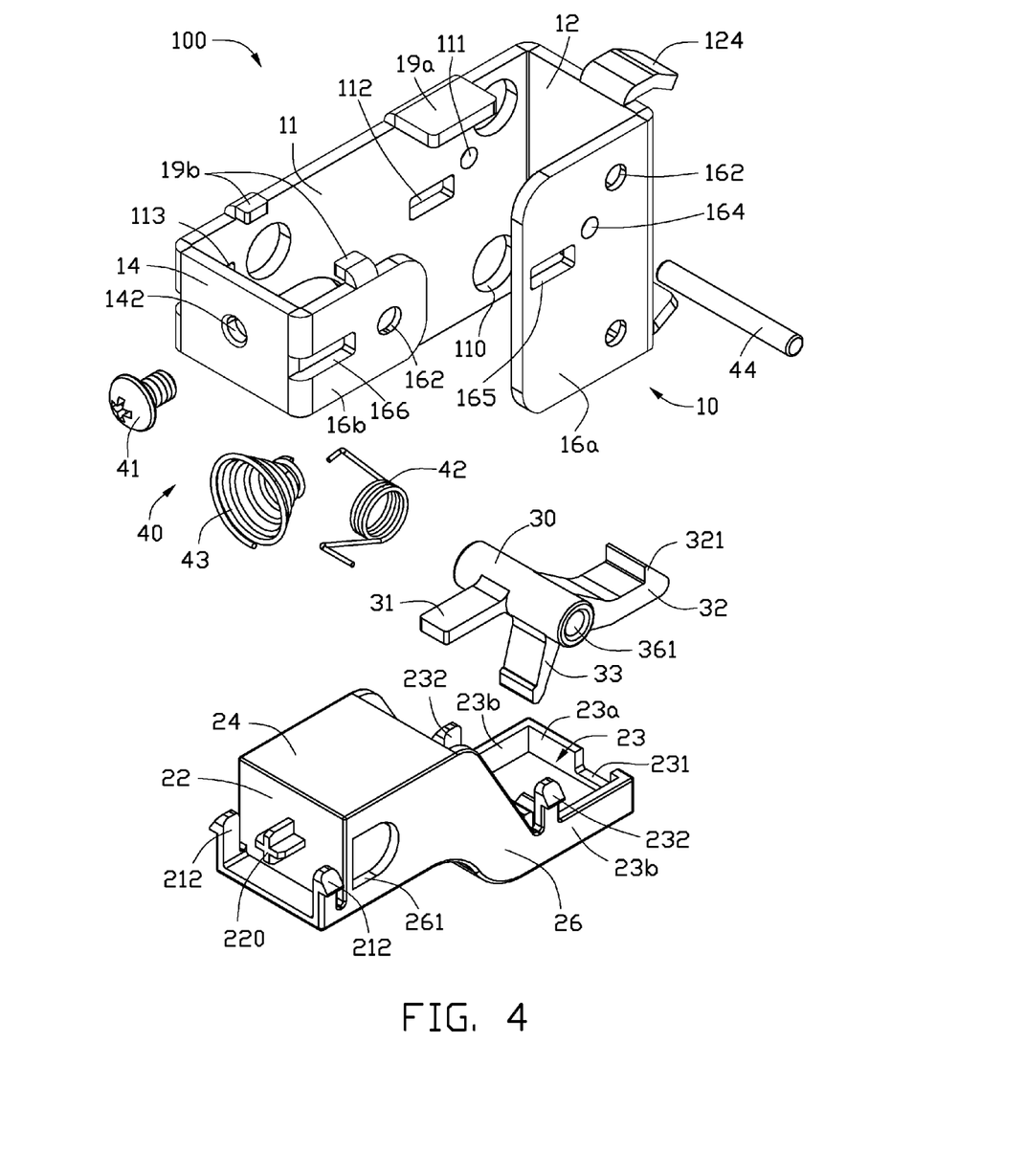
FIG. 4 is similar to FIG. 3, but shown from another direction.

Also referring to FIGS. 3 and 4, the outer case 10 includes a first outer wall 11, a second outer wall 12, a third outer wall 14, a fourth outer wall 16a, and a fifth outer wall 16b. The first outer wall 11, the second outer wall 12, the third outer wall 14, the fourth outer wall 16a, and the fifth outer wall 16b are all substantially planar boards. The first outer wall 11 is approximately L-shaped, that is, one end of the first outer wall 11 is wider than the opposite end of the first outer wall 11. The second outer wall 12 is perpendicularly connected to the wider end of the first outer wall 11, the third outer wall 14 is perpendicularly connected to the narrower end of the first outer wall 11, and a length of the second outer wall 12 is greater than a length of the third outer wall 14. The fourth outer wall 16a is perpendicularly connected to the second outer wall 12, and a width of the fourth outer wall 16a equals a width of the second outer wall 12. The fifth outer wall 16b is perpendicularly connected to the third outer wall 14, and a width of the fifth outer wall 16b equals a width of the third outer wall 14. Both the fourth outer wall 16a and the fifth outer wall 16b are parallel to the first outer wall 11, and the fourth outer wall 16a and the fifth outer wall 16b are coplanar. Furthermore, the fourth outer wall 16a and the fifth outer wall 16b extend towards each other, such that the first outer wall 11, the second outer wall 12, the third outer wall 14, the fourth outer wall 16a, and the fifth outer wall 16b cooperatively form a first reception space 18.

The first outer wall 11 defines at least three first assembly holes 110, a first axle hole 111, a first sliding groove 112, and a second sliding groove 113. The first assembly holes 110 are defined adjacent to corners of the first outer wall 11. The first axle hole 111 and the first sliding groove 112 are defined in a middle portion of the first outer wall 11. The second sliding groove 113 is defined at the narrow end of the first outer wall 11 and extends to a side edge of the first outer wall 14. The second outer wall 12 defines a rectangular first engaging hole 122 in a central portion thereof. A retaining latch 123 is perpendicularly connected to an inner surface of the second outer wall 12 and is adjacent to a side of the first engaging hole 122. Two retaining catches 124 perpendicularly extend from opposite ends of an outer surface of the second outer wall 12 respectively, and are bent towards each other. The third outer wall 14 defines a second engaging hole 142 in a central portion thereof, and the second engaging hole 142 has an internal thread. The fourth outer wall 16a defines at least two second assembly holes 162, a second axle hole 164, and a third sliding groove 165. The fifth outer wall 16b defines at least one second assembly hole 162 and a fourth sliding groove 166.

Furthermore, the outer case 10 includes a first partition element 19a and two second partition elements 19b. The first partition element 19a and the two second partition elements 19b are all substantially planar boards, and are positioned coplanar. The first partition element 19a and one of the two second partition elements 19b are perpendicularly connected to a side edge of the first outer wall 11, and the other of the two second partition elements 19b is perpendicularly connected to a side edge of the fifth outer wall 16b. The first partition element 19a extends towards the second outer wall 12. The two second partition elements 19b extend towards each other.

The inner case 20 includes a first inner wall 21, a second inner wall 22, a third inner wall 23, a fourth inner wall 24, a fifth inner wall 25, and a sixth inner wall 26. The first inner wall 21 includes a first wall portion 21a, a second wall portion 21b, and a third wall portion 21c. Both the first wall portion 21a and the third wall portion 21c are substantially planar boards, and the second wall portion 21b is substantially curved. One end of the second wall portion 21b is connected to the first wall portion 21a, and the other end of the second portion 21b is smoothly bent and connected to the third wall portion 21c. The first wall portion 21a and the third wall portion 21c are substantially parallel to each other. The third wall portion 21c defines a rectangular second engaging hole 210 therein. Two first latching hooks 212 are formed on an inner surface of the third wall portion 21c. The two first latching hooks 212 are perpendicularly connected to two opposite sides of a distal end of the inner surface of the third wall portion 21c, respectively, and extend away from each other.

The second inner wall 22 is substantially a flat rectangular board perpendicularly connected to the inner surface of the third wall portion 21c, and is positioned adjacent to and substantially parallel to the two first latching hooks 212. An adjusting pole 220 perpendicularly protrudes from a central portion of an outer surface of the second inner wall. In this embodiment, the adjusting pole 220 in section is the shape of a cross. In other embodiments, the adjusting pole 220 can also be cylindrical.

The third inner wall 23 is substantially a U-shaped frame formed on a peripheral portion of an inner surface of the first wall portion 21a. The third inner wall 23 includes a connection portion 23a and two arm portions 23b. The connection portion 23a and the two arm portions 23b are all substantially planar boards. The connection portion 23a is perpendicularly connected to a distal end of the inner surface the first wall portion 21a, and the two arm portions 23b are perpendicularly connected to opposite side edges of the inner surface of the first wall portion 21a, respectively. The two arm portions 23b are perpendicularly connected to two ends of the connection portion 23a, respectively. The connection portion 23a defines a retaining gap 231. The third inner wall 23 further includes two second latching hooks 232. Each of the second latching hooks 232 is formed at a distal end of one of the two arm portions 23b that is opposite to the connection portion 23a. Distal ends of the two second latching hook 232 extend away from each other.

The fourth inner wall 24 is substantially a flat rectangular board. The fourth inner wall 24 is perpendicularly connected to the second inner wall 22 and is parallel to the first wall portion 21a. A length of the fourth inner wall 24 approximately equals a length of the first wall portion 21a. Both the fifth inner wall 25 and the sixth inner wall 26 are substantially right-trapezoid-shaped flat pieces, and are parallel to each other. Shapes and sizes of the fifth inner wall 25 and the sixth inner wall 26 are substantially similar to each other. Each of the fifth inner wall 25 and the sixth inner wall 26 is perpendicularly connected to the first wall portion 21a, the second inner wall 22, and the fourth inner wall 24 via three right-angle sides, respectively. Oblique sides of the fifth inner wall 25 and the sixth inner wall 26 extend to reach the distal ends of the two arm portions 23b, respectively. The fifth inner wall 25 defines a third engaging hole 251, and the sixth inner wall 26 defines a fourth engaging hole 261. The third engaging hole 251 and the fourth engaging hole 261 have similar shapes and sizes, and are aligned with each other. Both the third engaging hole 251 and the fourth engaging hole 261 are adjacent to the second inner wall 22.

Figure 5:
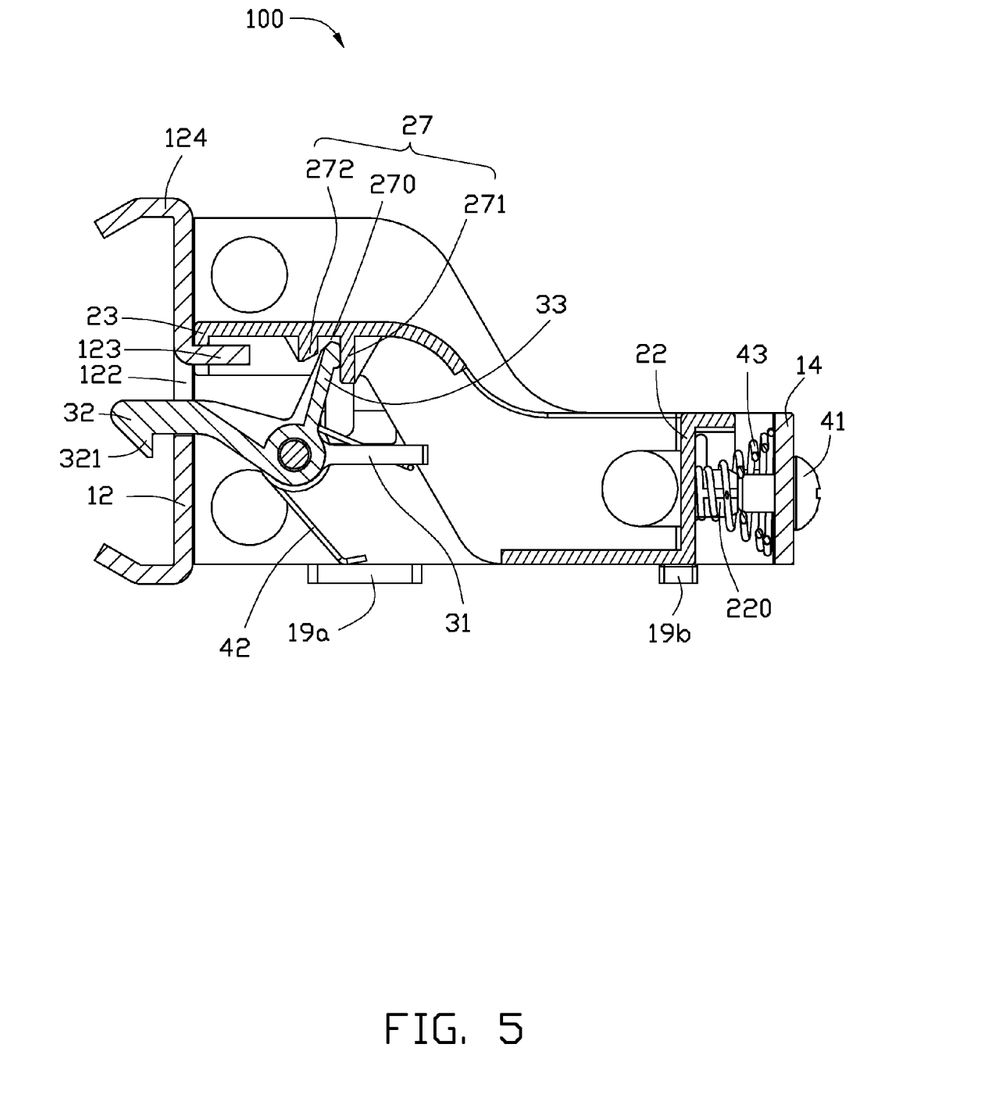
FIG. 5 is a cutaway view of the retaining apparatus shown in FIG. 2, wherein the retaining apparatus is in a retaining mode.
Figure 6:
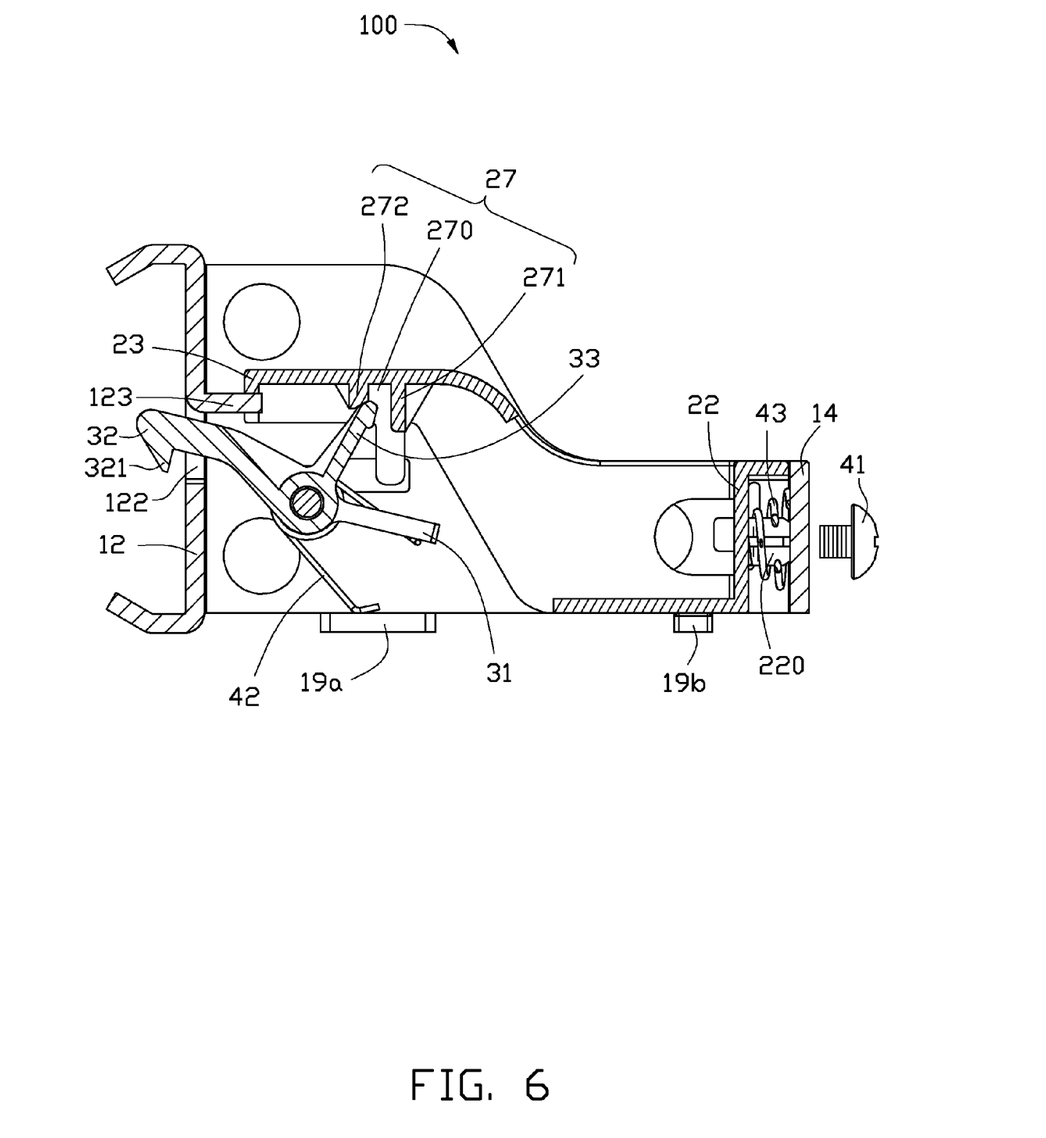
FIG. 6 is another cutaway view of the retaining apparatus shown in FIG. 2, wherein the retaining apparatus is in a releasing mode.

Also referring to FIG. 5 and FIG. 6, the inner case 20 further includes a retaining structure 27. The retaining structure 27 includes a first flange 271 and a second flange 272. Both the first flange 271 and the second flange 272 perpendicularly protrude from a middle portion of the inner surface of the first wall portion 23a, and extend parallel to the connection portion 23a. The second flange 272 is closer to the connection portion 23a than is the first flange 271, that is, the second flange 272 is positioned between the connection portion 23a and the first flange 271. A retaining slot 270 is formed between the first flange 271 and the second flange 272. A height of the first flange 271 is greater than a height of the second flange 272.

In this embodiment, a length of the first outer wall 11 is greater than a length of the first inner wall 21. A length of the third outer wall 14 approximately equals a length of the second inner wall 22. Widths of the second outer wall 12 and the third outer wall 14 approximately equal widths of the first inner wall 21, the second inner wall 22, and the fourth inner wall 24. In this way, the inner case 20 can be received in the outer case 10 and move along an extending direction of the first inner wall 21 within the outer case 10.

The rotation element 30 includes a first arm 31, a second arm 32, a third arm 33, and a sleeve 36. The sleeve 36 is a hollow cylinder and defines a third axle hole 361 along an axis thereof. The first arm 31, the second arm 32, and the third arm 33 are all bars connected to a cylindrical outer surface of the sleeve 36, and the first arm 31, the second arm 32, and the third arm 33 extend along different radial directions of the sleeve 36, respectively. The first arm 31 is positioned adjacent to one end of the sleeve 36, and the second arm 32 and the third arm 33 are positioned adjacent to the other end of the sleeve 36. A distal end of the first arm 32 is bent about 90 degrees to form a latching portion 321.

The operation mechanism 40 includes a fastening element 41, a first elastic element 42, a second elastic element 43, and an adjusting axle 44. The fastening element 41 is a screw and can be screwed into the second engaging hole 142. The second elastic element 42 is a torison spring and can be coiled on the sleeve 36. The second elastic element 43 is a coil tension spring and can be coiled on the fastening element 41 and the adjusting pole 220. The adjusting axle 44 is a cylinder and can be inserted through the first axle hole 111, the second axle hole 164, and the third axle hole 361.

Also referring to FIGS. 5 and 6, in assembly, the first elastic element 42 is coiled on an end of the sleeve 36 that is adjacent to the first arm 31, and one end of the first elastic element 42 is secured on the first arm 31. The rotation element 30 and the first elastic element 42 are placed into the first reception space 18. The latching portion 321 is inserted into the first engaging hole 122, and is exposed out of the outer case 10 via the first engaging hole 122. Another end of the first elastic element 42 is secured on the first partition element 19a. The third axle hole 361 is aligned with the first axle hole 111 and the second axle hole 164, and the adjusting axle 44 passes through the first axle hole 111, the third axle hole 361, and the second axle hole 164 to rotatably mount the rotation element 30 on the outer case 10.

The fastening element 41 is screwed into the third engaging hole 142, and a distal end of the fastening element 41 enters the first reception space 18. The second elastic element 43 is placed into the first reception space 18, and is coiled on the fastening element 41. The inner case 20 is received in the outer case 10. The fourth inner wall 24 is aligned with the second partition elements 19b, and is supported by the second partition elements 19b. The second inner wall 22 is aligned with the third outer wall 14, the adjusting pole 220 is aligned with the third engaging hole 142, and the first elastic element 43 is coiled on the adjusting pole 220. One end of the second elastic element 43 is secured on the inner surface of the third outer wall 14, and the other end of the second elastic element 43 is secured on the inner surface of the second inner wall 22.

The retaining latch 123 is inserted into the retaining gap 231. A distal end of the third arm 33 is inserted into the retaining slot 270. The distal ends of the two first latching hooks 212 are inserted into the second sliding groove 113 and the fourth sliding groove 166 and can slide along the second sliding groove 113 and the fourth sliding groove 166, respectively. The distal ends of the two second latching hooks 232 are inserted into the first sliding groove 112 and the third sliding groove 165 and can slide along the first sliding groove 112 and the third sliding groove 165 respectively. Thus, assembly of the retaining apparatus 100 is completed.

In use, each retaining apparatus 100 is secured on the server 200 via the first assembly holes 110 or the second assembly holes 162. For example, conventional assembly components, such as bolts or rivets, can be used in the first assembly holes 110 or the second assembly holes 162 and be secured on the server 200 to secure the retaining apparatus 100 on the server 200. In this way, both two opposite sides of each retaining apparatus 100 can be secured to the server 200.

When each retaining apparatus 100 has been secured to the server 200, the server 200 with the retaining apparatuses 100 secured thereto is attached to the holding poles 300. Each retaining apparatus 100 is attached to one of the holding poles 300, and the two first latching hooks 124 and the first arm 21 of the retaining apparatus 100 are inserted into three holding holes 320 of the holding pole 300.

Also referring to FIG. 5, when the first arm 21 is inserted into a corresponding holding hole 320, the fastening element 41 is screwed further into the second engaging hole 142. The distal end of the fastening element 41 is driven to resist the distal end of the adjusting pole 220, and the inner case 20 of the retaining apparatus 100 is pushed towards the second outer wall 12. The latching hooks 212, 232 slide along the sliding grooves 112, 113, 165, 166, respectively, and the inner surface of the second outer wall 12 resists the inner case 20. The second elastic element 43 is stretched. The first flange 271 resists the distal end of the third arm 33, and drives the third arm 33 to move towards the second outer wall 12. The rotation element 30 is thus rotated, and the second arm 32 is driven downwards. The latching portion 321 is then moved towards the outer surface of the second outer wall 12, and a portion (not shown) of the holding pole 300 that is sandwiched between the latching portion 321 and the second outer wall 12 is tightly clamped. In this way, the retaining apparatus 100 is in a retaining mode, and the server 200 is secured in both vertical and horizontal directions by the retaining apparatus 100. At the same time, the first arm 31 is driven upwards, and the first elastic element 42 is accordingly deformed.

Also referring to FIG. 6, when the assembled retaining apparatus 100 is not being used to retain the server 200, the retaining apparatus 100 is changed to a releasing mode. In this condition, the fastening element 41 is unscrewed from the second engaging pole 142, and the first elastic element 42 rebounds (i.e., pulls back) and drives the inner case 20 to move towards the third outer wall 14. The first flange 271 retreats and does not resist the distal end of the third arm 33. When the third arm 33 is released, the first elastic element 42 rebounds and drives the first arm 31 to move downwards. Thus, the rotation element 30 is driven to rotate, and the second arm 32 is driven to move upwards. In this way, the portion of the holding pole 300 that is clamped in the retaining mode is released, and the retaining apparatus 100 can be detached from the holding pole 300.

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. A retaining apparatus for retaining a computer server on a server cabinet; comprising:
   an outer case configured to be secured to the computer server;
   an inner case movably received in the outer case;
   a rotation element including a sleeve, a first arm, a second arm, and a third arm; all of the first arm, the second arm, and the third connected to the sleeve; the sleeve rotatably received in the outer case; the first arm and the third arm movably received in the outer case, and the third arm engaging with the inner case; the second arm exposed out of the outer case; and
   an operation mechanism including a first elastic element, the first elastic element mounted on the rotation element and secured on the first arm; and
   wherein when the inner case reaches a first position in the outer case, the inner case resists the third arm and drives the rotation element to rotate, the second arm and the outer case is driven to clamp a portion of the server cabinet and secure the retaining apparatus to the server cabinet, and the first elastic element is deformed; and when the inner case reaches a second position in the outer case, the inner case releases the third arm, the first elastic element rebounds and drives the rotation element to rotate, and the second arm and the outer case release the clamped portion of the server cabinet.

2. The retaining apparatus of claim 1, wherein the first elastic element is a torison spring coiled on the sleeve, and two ends of the first elastic element are respectively secured on the first arm and the outer case.

3. The retaining apparatus of claim 2, wherein the operation mechanism further includes a fastening element that is capable of being screwed into and out of the outer case, the inner case includes an adjusting pole aligned with the fastening element, and the inner case is driven to move to the first position by screwing the fastening element into the outer case and using the fastening portion to resist the adjusting pole.

4. The retaining apparatus of claim 3, wherein the operation mechanism further includes a second elastic element, the second elastic element is a tension spring coiled on the adjusting pole, and two ends of the second elastic element are respectively secured on the outer case and the inner case.

5. The retaining apparatus of claim 4, wherein the second elastic element is stretched when the inner case reaches the first position, and the second elastic element rebounds and drives the inner case to move to the second position when the fastening element is screwed out of the outer case.

6. The retaining apparatus of claim 1, wherein the outer case further includes two retaining catches formed on a surface of the outer case where the second arm is exposed out, and the two retaining catches are configured to secure the retaining apparatus on the server cabinet.

7. The retaining apparatus of claim 1, wherein the outer case defines a plurality of first assembly holes in one side and a plurality of second assembly holes in another opposite side, and the first and second assembly holes are all configured to secure the retaining apparatus to the computer server.

8. A server cabinet for retaining at least one computer server, comprising:
- a plurality of holding poles; and
- a plurality of retaining apparatuses, each of the plurality of retaining apparatuses including:
  - an outer case configured to be secured to the at least one computer server;
  - an inner case movably received in the outer case;
  - a rotation element including a sleeve, a first arm, a second arm, and a third arm;
  - all of the first arm, the second arm, and the third connected to the sleeve; the sleeve rotatably received in the outer case; the first arm and the third arm movably received in the outer case, and the third arm engaging with the inner case; the second arm exposed out of the outer case; and
  - an operation mechanism including a first elastic element, the first elastic element mounted on the rotation element and secured on the first arm; and
- wherein when the inner case reaches a first position in the outer case, the inner case resists the third arm and drives the rotation element to rotate, the second arm and the outer case is driven to clamp a portion of one of the plurality of holding poles and secure the retaining apparatus to the holding pole, and the first elastic element is deformed; and when the inner case reaches a second position in the outer case, the inner case releases the third arm, the first elastic element rebounds and drives the rotation element to rotate, and the second arm and the outer case release the clamped portion of the holding pole.

9. The server cabinet of claim 8, wherein the first elastic element is a torison spring coiled on the sleeve, and two ends of the first elastic element are respectively secured on the first arm and the outer case.

10. The server cabinet of claim 9, wherein the operation mechanism further includes a fastening element that is capable of being screwed into and out of the outer case, the inner case includes an adjusting pole aligned with the fastening element, and the inner case is driven to move to the first position by screwing the fastening element into the outer case and using the fastening portion to resist the adjusting pole.

11. The server cabinet of claim 10, wherein the operation mechanism further includes a second elastic element, the second elastic element is a tension spring coiled on the adjusting pole, and two ends of the second elastic element are respectively secured on the outer case and the inner case.

12. The server cabinet of claim 11, wherein the second elastic element is stretched when the inner case reaches the first position, and the second elastic element rebounds and drives the inner case to move to the second position when the fastening element is screwed out of the outer case.

13. The server cabinet of claim 8, wherein the outer case further includes two retaining catches formed on a surface of the outer case where the second arm is exposed out, each of the plurality of holding poles defines a plurality of holding holes, and the second arm and the two retaining catches are respectively inserted in three holding holes of one of the plurality of holding poles to secure the retaining apparatus on the holding pole.

14. The server cabinet of claim 8, wherein the outer case defines a plurality of first assembly holes in one side and a plurality of second assembly holes in another opposite side, and the first and second assembly holes are all configured to secure the retaining apparatus to the computer server.

* * * * *